United States Patent
Kuo et al.

(10) Patent No.: US 7,382,163 B2
(45) Date of Patent: Jun. 3, 2008

(54) PHASE FREQUENCY DETECTOR USED IN DIGITAL PLL SYSTEM

(75) Inventors: Yu-Pin Kuo, Taichung (TW); Yu-Pin Chou, Tongsiao Township, Miaoli County (TW); Shu-Rong Tong, Kaohsiung (TW)

(73) Assignee: Realtek Semiconductor Corp., Hsinchu (TW)

( * ) Notice: Subject to any disclaimer, the term of this patent is extended or adjusted under 35 U.S.C. 154(b) by 793 days.

(21) Appl. No.: 10/820,473

(22) Filed: Apr. 7, 2004

(65) Prior Publication Data

US 2004/0223574 A1 Nov. 11, 2004

(30) Foreign Application Priority Data

May 6, 2003 (TW) .............................. 92112296 A

(51) Int. Cl.
*G01R 25/00* (2006.01)
(52) U.S. Cl. .............................. 327/7; 327/12; 327/156
(58) Field of Classification Search .................... 327/7, 327/12, 156
See application file for complete search history.

(56) References Cited

U.S. PATENT DOCUMENTS

| 5,191,239 | A | | 3/1993 | Rogers | 327/12 |
| 5,220,293 | A | | 6/1993 | Rogers | 331/15 |
| 5,371,425 | A | | 12/1994 | Rogers | 327/3 |
| 5,896,066 | A | * | 4/1999 | Katayama et al. | 331/17 |
| 5,963,058 | A | | 10/1999 | Thomas | 327/3 |
| 6,140,853 | A | * | 10/2000 | Lo | 327/157 |
| 6,404,291 | B1 | | 6/2002 | Riley | 331/11 |
| 6,683,478 | B2 | * | 1/2004 | Yoo | 327/12 |
| 7,102,448 | B2 | * | 9/2006 | Chou et al. | 331/25 |

* cited by examiner

*Primary Examiner*—Kenneth B. Wells
(74) *Attorney, Agent, or Firm*—Thomas, Kayden, Horstemeyer & Risley

(57) ABSTRACT

A phase frequency detector includes a phase error detector outputting a phase error signal according to a first input signal and a second input signal; a phase error judgment unit outputting a phase error judgment signal according to the first input signal and the second input signal; and a reset unit outputting a first reset signal to reset the phase error detector, and outputting a second reset signal to reset the phase error judgment unit, according to the phase error judgment signal.

17 Claims, 7 Drawing Sheets

PHASE FREQUENCY DETECTOR USED IN DIGITAL PLL SYSTEM

This application claims the benefit of Taiwan application Serial No. 092112296, filed May 06, 2003, the subject matter of which is incorporated herein by reference.

BACKGROUND OF THE INVENTION

1. Field of the Invention

The invention relates to a phase frequency detector, and more particularly to a phase frequency detector used in a digital PLL system.

2. Description of the Related Art

A PLL (phase locked loop) is an automatic control circuit system capable of tracking the frequency and phase of an input signal, and is widely utilized in the field of frequency synthesis, clock/data recovery, clock de-skewing, and the like. Typical PLLs may be substantially divided into analog PLLs (APLL) and digital PLLs (DPLL).

FIG. 1 is a block diagram showing the system architecture of a conventional digital PLL. The digital PLL includes a phase frequency detector (PFD) 100, a phase error quantizer 110, a digitally controlled oscillator (DCO) 120 and a frequency divider 130. The PFD 100 compares a feedback signal $F_i$ and an input signal $F_r$, determines a phase error therebetween, and outputs a phase error signal according to the phase error. Typical phase error signal is composed of an UP signal and a DOWN signal. The values of and the time difference between the two signals may represent the magnitude of the phase error between the feedback signal $F_i$ and the input signal $F_r$. The phase error quantizer 110 quantizes the magnitude of the phase error and outputs a count signal COUNT according to the signal values of the UP signal and the DOWN signal, and the time difference therebetween. The DCO 120 outputs an output signal $F_o$ according to the magnitude of the count signal COUNT, and the output signal $F_o$ is then fed back through the divider 130 to the PFD 100 as the feedback signal $F_i$.

FIG. 2 shows the circuit architecture of a conventional phase frequency detector (PFD), which is detailed in U.S. Pat. No. 5,963,058, whose content is incorporated herein by reference. The PFD includes two D-type flip-flops 200 and 210 for generating the UP signal and the DOWN signal according to the input signal $F_r$ and the feedback signal $F_i$, respectively, and an AND gate 220 for resetting the two flip-flops 200, 210. The operation principle of the phase frequency detector will be described with reference to the timing chart of FIG. 3A. It is assumed that the devices of the PFD mentioned above are rising-edge triggered devices, and that the $F_r$ signal leads the $F_i$ signal. The flip-flop 200 outputs the UP signal with a high level upon change of the $F_r$ signal. Sequentially, the flip-flop 210 outputs the DOWN signal with a high level upon change of the $F_i$ signal. When the UP signal and the DOWN signal are both of high level, the AND gate 220 outputs a reset signal RESET for resetting the flip-flops 200 and 210. As a result, the UP signal and the DOWN signal both return to low level. The operation under the situation when the signal $F_r$ lags behind the signal $F_i$ can be similarly derived.

As is well known to those skilled in the art, the PFD in FIG. 2 suffers from the drawbacks of the so-called "dead zone" phenomenon, as well as limitations on the counting resolution of the PFD induced by the delay in the reset path (i.e., the AND gate 220 in FIG. 2). Please refer to FIG. 3B, which illustrates the counting resolution limitation of the PFD mentioned above. When the phase error between the input signal $F_r$ and the feedback signal $F_i$ is smaller than a clock signal, the quantizer cannot detect the phase error therebetween and thus is not able to obtain a count signal COUNT.

SUMMARY OF THE INVENTION

It is therefore an object of the invention to provide a phase frequency detector capable of alleviating the dead zone phenomenon as well as the counting resolution limitation.

According to embodiments of the present invention, a phase frequency detector is disclosed. The phase frequency detector includes a phase error detector outputting a phase error signal according to a first input signal and a second input signal; a phase error judgment unit outputting a phase error judgment signal according to the first input signal and the second input signal; and a reset unit outputting a first reset signal to reset the phase error detector, and outputting a second reset signal to reset the phase error judgment unit, according to the phase error judgment signal.

Other objects, features, and advantages of the invention will become apparent from the following detailed description of embodiments of the invention. The following description is made with reference to the accompanying drawings.

DETAILED DESCRIPTION OF THE INVENTION

Figure 1:
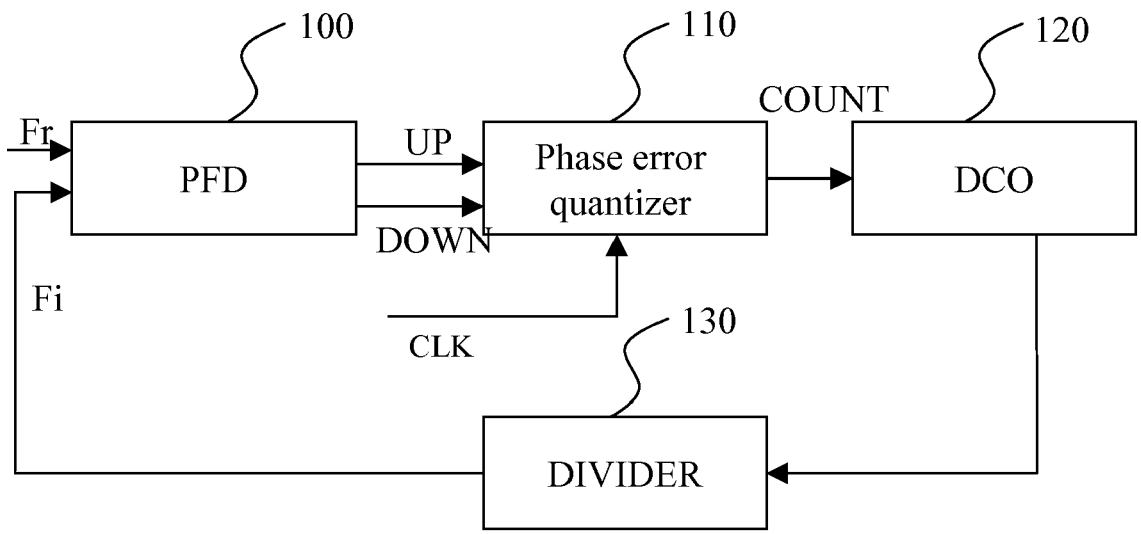
FIG. 1 is a block diagram showing the system architecture of a typical digital PLL.
Figure 2:
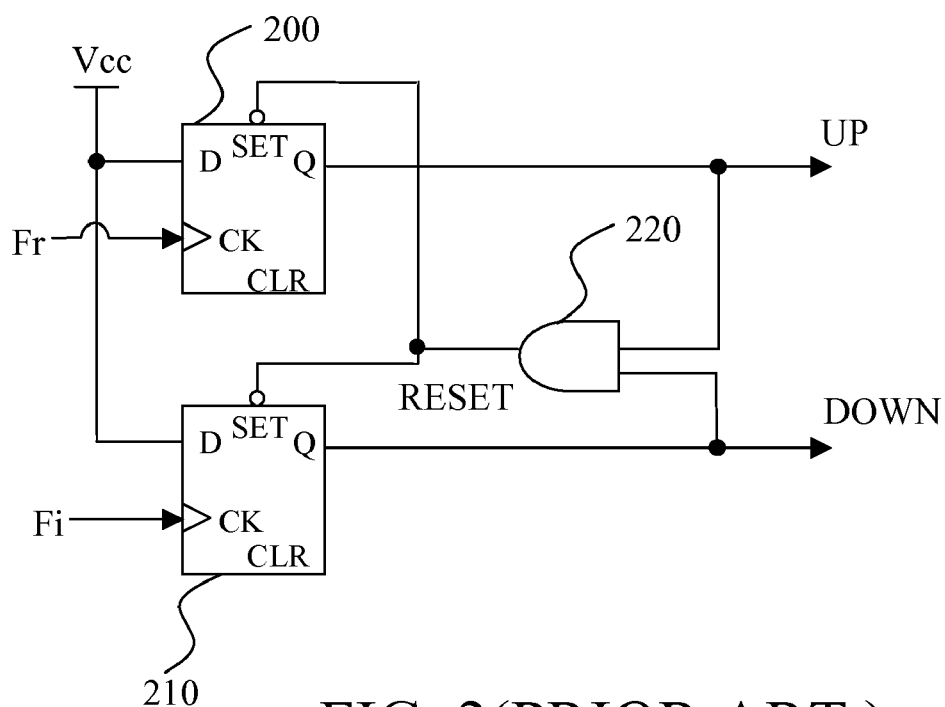
FIG. 2 shows the circuit architecture of a conventional phase frequency detector.
Figure 3A:
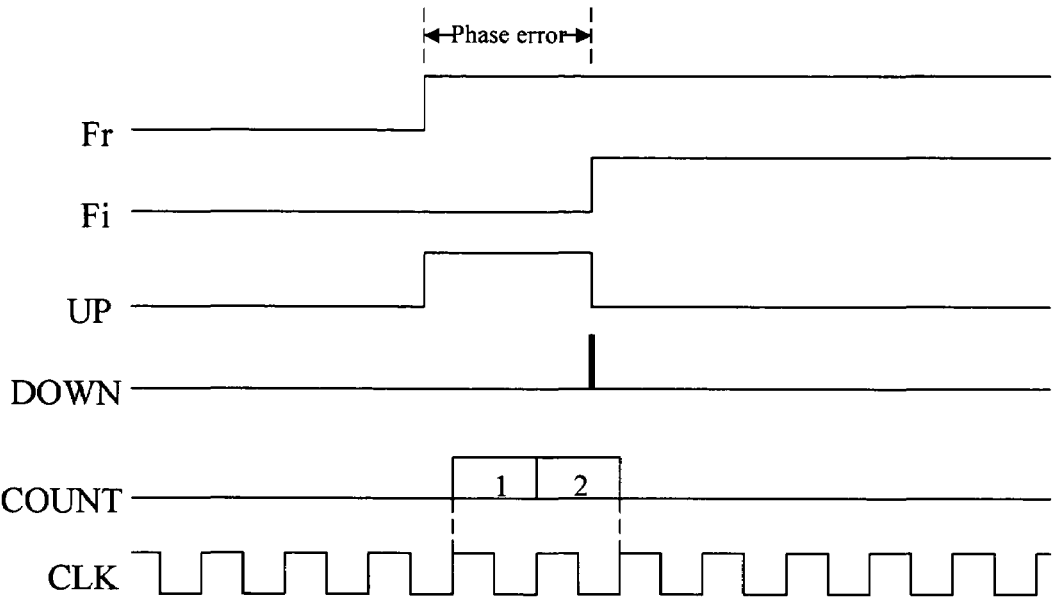
FIGS. 3A and 3B are schematic illustrations showing timing of the PFD in FIG. 2.
Figure 3B:
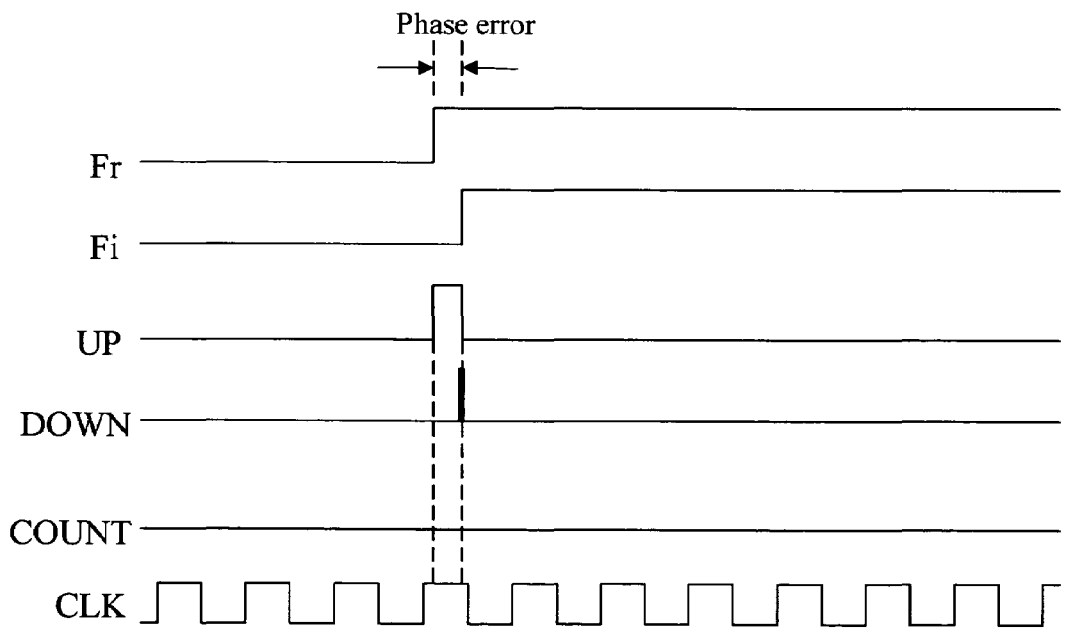
Figure 4:
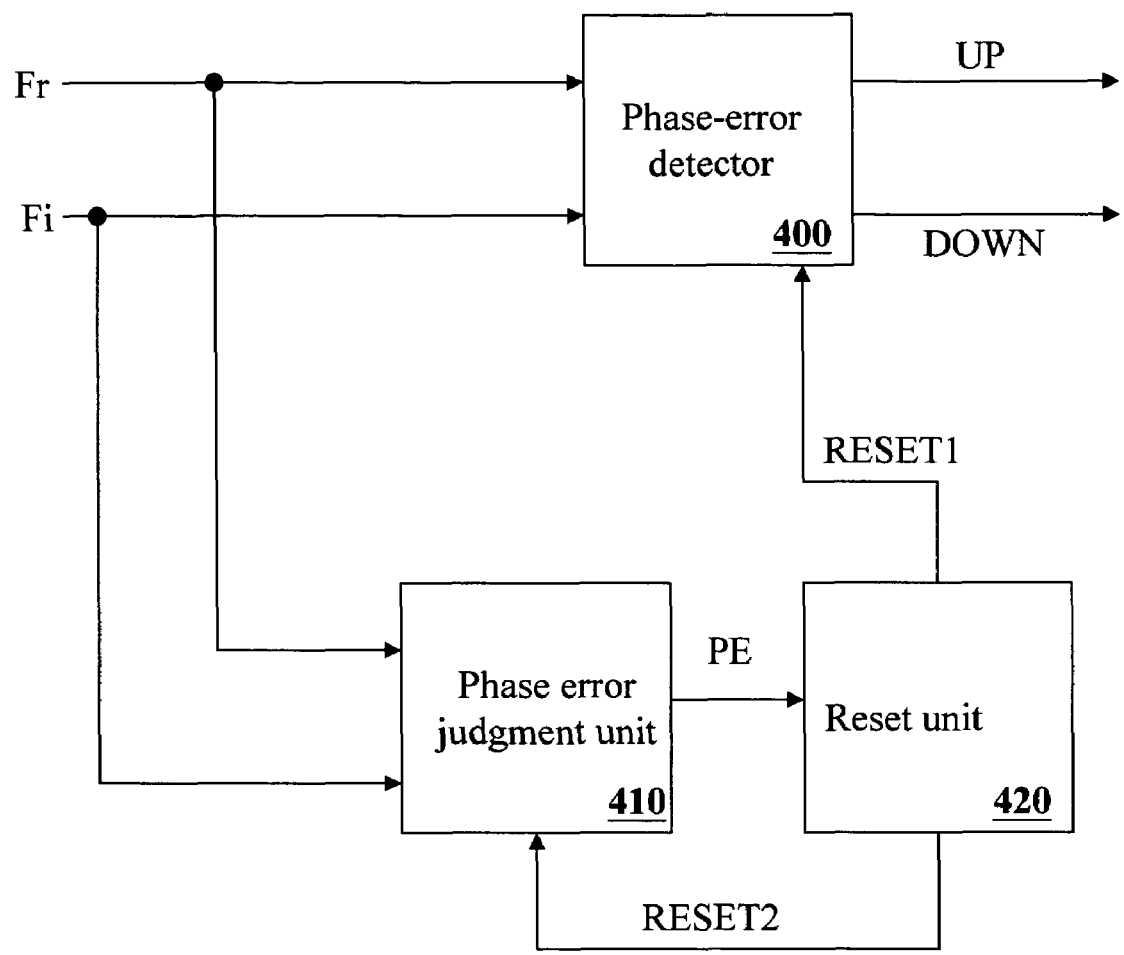
FIG. 4 is a block diagram showing the architecture of a phase frequency detector according to an embodiment of the invention.

FIG. 4 is a functional block diagram showing a phase frequency detector according to an embodiment of the invention. The PFD in FIG. 4 includes a phase-error detector 400, a phase error judgment unit 410, and a reset unit 420. The phase error judgment unit 410 and the phase-error detector 400 synchronously receive an input signal $F_r$ and a feedback signal $F_i$, and the phase error judgment unit 410 outputs a phase error judgment signal to the reset unit 420 according to a phase error between the input signal $F_r$ and the feedback signal $F_i$. The reset unit 420 outputs a first reset signal RESET1 to reset the phase-error detector 400, as well as a second reset signal RESET2 to reset the phase error judgment unit 410, according to the phase error judgment signal.

Figure 5:
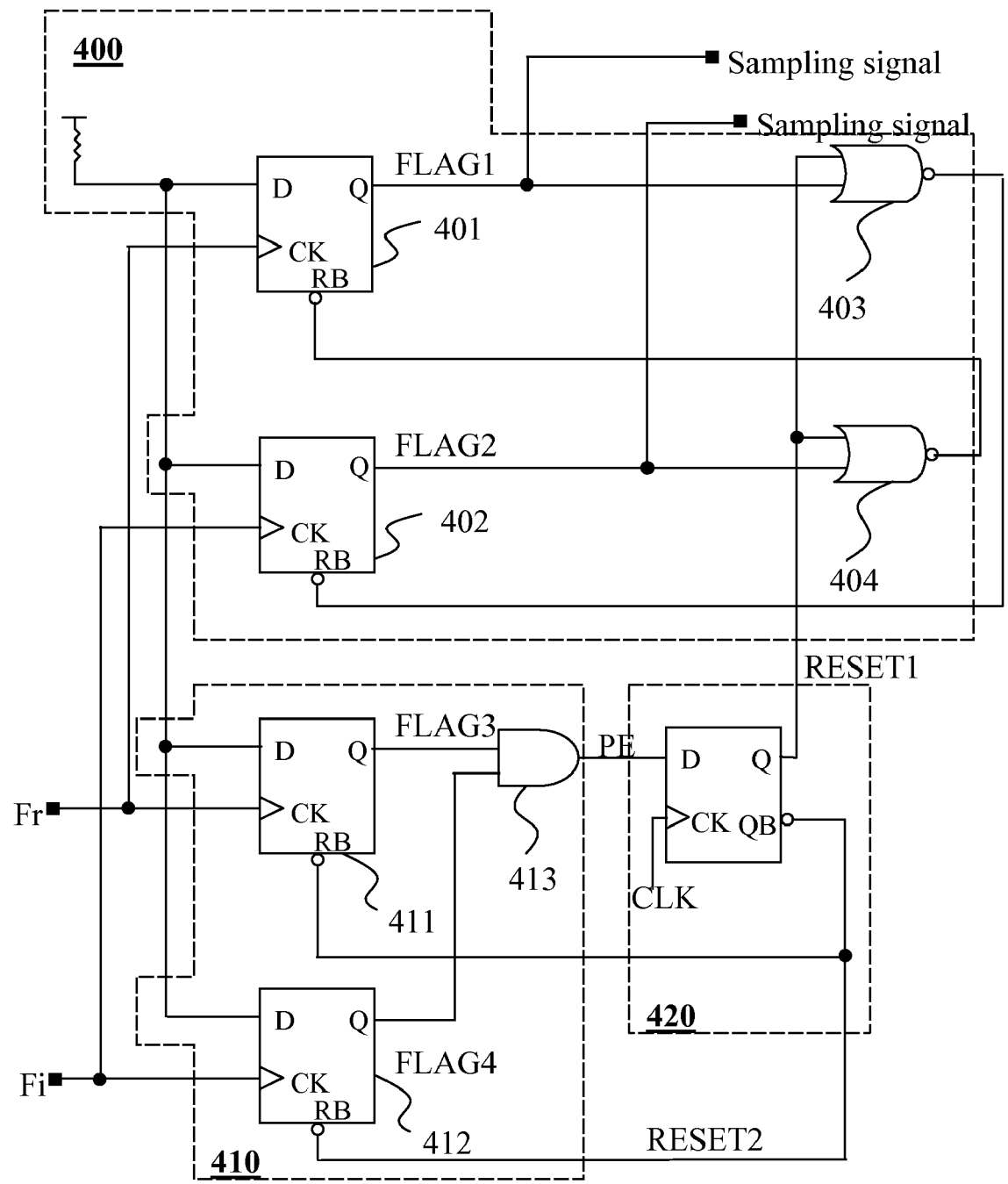
FIG. 5 is a detailed circuit diagram showing a phase frequency detector in FIG. 4 according to an embodiment of the invention.

FIG. 5 is a detailed circuit diagram showing the phase frequency detector of FIG. 4 according to an embodiment of the invention. The phase-error detector 400 includes a first flip-flop 401, a second flip-flop 402, a first pre-reset unit 403 and a second pre-reset unit 404. The first flip-flop 401 and the second flip-flop 402 are D-type flip-flops, whose operation is well known to those skilled in the art. The first and second flip-flops 401, 402 couple to a positive power supply source at signal input terminals D, and receive the input signal $F_r$ and the feedback signal $F_i$ at clock input terminals CK, respectively. The signal output terminals Q of the first and second flip-flops 401 and 402 output a first flag FLAG1 signal and a second flag FLAG2 signal, respectively. The first flag signal is outputted as the UP signal while the second flag signal the DOWN signal. The first and second flag signals are inputted to the first and second pre-reset units 403 and 404, respectively. In this embodiment, the first and second pre-reset units 403 and 404 are NOR gates. The first pre-reset unit 403 is used to reset the second flip-flop 402, and the second pre-reset unit 404 is used to reset the first flip-flop 401.

The phase error judgment unit 410 is for judging the magnitude of the phase error between the input signal $F_r$ and the feedback signal $F_i$, and the reset unit 420 is for outputting reset signals RESET1, RESET2 to reset the phase-error detector 400 and the phase error judgment unit 410, respectively. The phase error judgment unit 410 includes a third flip-flop 411, a fourth flip-flop 412, and an AND gate 413. The third and fourth flip-flops 411 and 412 are D-type flip-flops, and have similar input configurations as the first and second flip-flops 401, 402. The third and fourth flip-flops 411 and 412 outputs a third flag FLAG3 signal and a fourth flag FLAG4 signal to the AND gate 413 according to the input signal $F_r$ and the feedback signal $F_i$, respectively. The AND gate 413 outputs the phase error judgment signal to the reset unit 420 according to the third and fourth flag signals.

The reset unit 420 is a D-type flip-flop receives the phase error judgment signal at a signal input terminal D, and receives a clock signal CLK at a clock input terminal CK. When the flip-flop 420 receives the phase error judgment signal, it outputs the first reset signal RESET1 from a first signal output terminal Q to reset phase-error detector 400 via the first and the second pre-reset units 403, 404, respectively, and a second reset signal RESET2 from a second signal output terminal QB to reset the phase error judgment unit 410. Please note that the second reset signal RESET2 herein is the complementary signal of the first reset signal RESET1. That is, as an alternative implementation, the phase error judgment unit 410 may also be reset by the first reset signal RESET1 via an inverter. Please also note that the clock signal CLK herein in this embodiment adopts the same clock signal as is used for triggering purpose in the post-stage quantizer.

Figure 6:
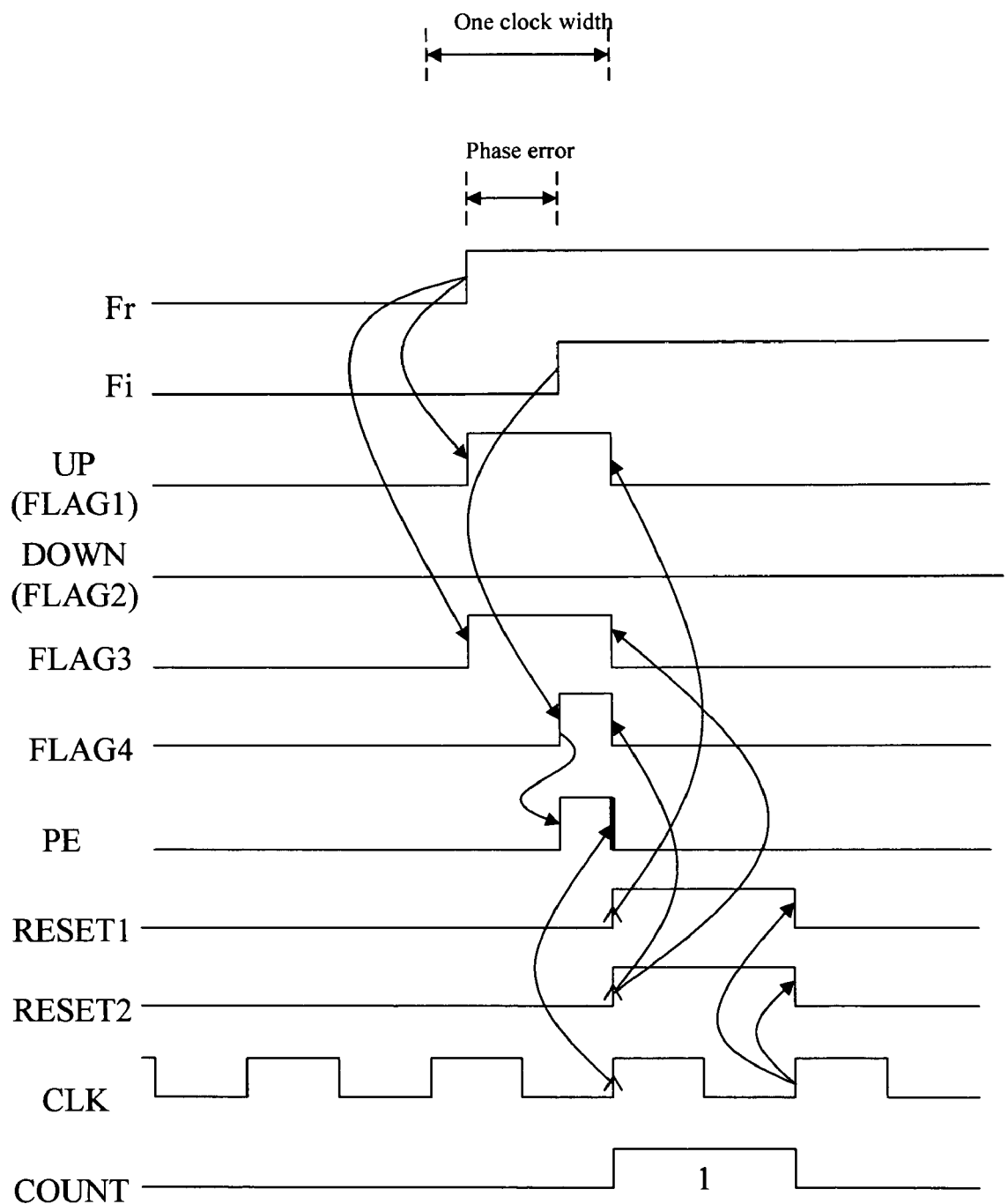
FIG. 6 is a schematic illustration showing the timing of the PFD in FIG. 5.

Now please refer to the timing chart of FIG. 6 for operations of the PFD in FIG. 5. It is assumed that all the circuit devices of the phase frequency detector in FIG. 5 are rising-edge triggered circuits. When the phase of the input signal $F_r$ leads that of the feedback signal $F_i$, the first and third flip-flops 401 and 411 simultaneously outputs first and third flag signals with high level. At this time, the phase-error detector 400 outputs the UP signal with the high level. Meanwhile, the first flag signal is inputted to the first pre-reset unit 403, which resets the second flip-flop 402 according to the received first flag signal so as to keep the second flag signal (i.e., the DOWN signal) at low level. When the feedback signal $F_i$ with lagging phase is inputted to the second and fourth flip-flops 402 and 412, the second flag signal will not be outputted as high level because the second flip-flop 402 still remains in a reset state. However, the fourth flag signal is outputted at high level.

Because now the third and fourth flag signals are at high level, the AND gate 413 outputs a phase error judgment signal PE to the reset unit 420. The reset unit 420 outputs the first reset signal RESET1 to the first and second pre-reset units 403 and 404 at a rising edge of a next clock signal, and thus the second pre-reset unit 404 is caused to reset the first flip-flop 401. At this time, the first flag signal (i.e., the UP signal) will be pulled back to low level. It is to be noted that in this embodiment, the first reset signal RESET1 will not be outputted to simultaneously reset the first and second flip-flops 401, 402 until a next clock cycle after the reset unit 420 receives the phase error judgment signal PE. Consequently, with proper designed propagation delay among circuit components, the post-stage quantizer may always sense (i.e., count) the existence of the outputted UP or DOWN signal as long as there exists a phase error between the input signal $F_r$ and the feedback signal $F_i$, even if the phase error between the two signals is smaller than one clock cycle, under which circumstance 1 is counted as shown in FIG. 6. Meanwhile, the reset unit 420 outputs the second reset signal RESET2 to reset the third and fourth flip-flops 411 and 412, respectively, so as to make the high-level third and fourth flag signals return to the low level simultaneously. The operation under the situation when the signal $F_r$ lags behind the signal $F_i$ can be similarly derived.

As shown in FIG. 5, because the first and second flip-flops 401 and 402 correspond to the third and fourth flip-flops 411 and 412, respectively, and the corresponding flip-flops receive the same signal and operate according to the same working principle, the propagation delay of the flip-flops 401 and 403 may be regarded as being substantially the same, and the propagation delay of the flip-flops 402 and 404 may also be regarded as being substantially the same.

Figure 7:
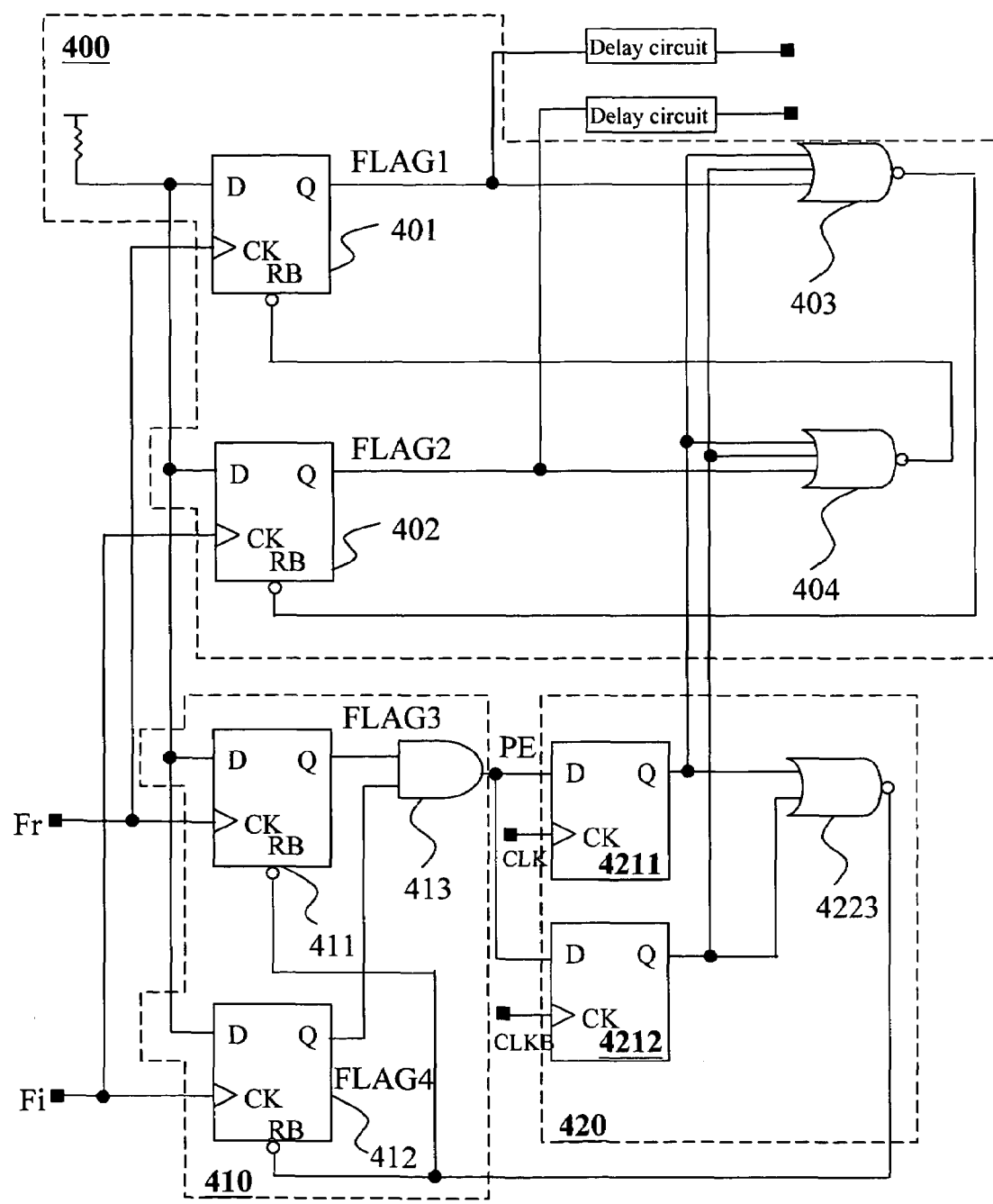
FIG. 7 is a detailed circuit diagram showing a phase frequency detector in FIG. 4 according to another embodiment of the invention.

The invention further proposes another embodiment, as shown in FIG. 7. The difference between FIGS. 7 and 5 is that the reset unit 420 of FIG. 7 includes a fifth flip-flop 4211, a sixth flip-flop 4212, and a NOR gate 4223. The fifth and sixth flip-flops 4211, 4212 receive the phase error judgment signal PE at signal input terminals D, and are coupled to the NOR gate 4223 at signal output terminals Q, wherein the NOR gate 4223 serves to reset the third and fourth flip-flops 411, 412. The fifth and sixth flip-flops 4211, 4212 receive the clock signal CLK and a complementary clock signal CLKB thereof at clock input terminals CK, respectively. The signal output terminals Q of the fifth and sixth flip-flops 4211, 4212 are also coupled to the NOR gates 403, 404, respectively. Please note that in FIG. 7 two delay circuits may be added to the transmission paths of the UP and DOWN signals, respectively, for properly adjusting propagation delay aiming to match the delay from the input to the output of the phase error judgment unit 410, with the delay from the input of the phase error detector 400 to the output of the delay circuits. By doing so, potential erroneous operations of the phase frequency detector may be avoided even with a small phase error between the signals $F_r$ and $F_i$.

Therefore, when the phase error judgment signal PE is simultaneously received, the phases of the first and second reset signals (RESET1, RESET2) output from the fifth and six flip-flops 4211 and 4212 differ from each other by a half clock cycle. Those skilled in the art will therefore be able to appreciate that the operation of outputting the reset signals (i.e., RESET1/RESET2) is equivalently clocked by one half of the clock cycle, which translates to enhancement in resolution.

Figure 8:
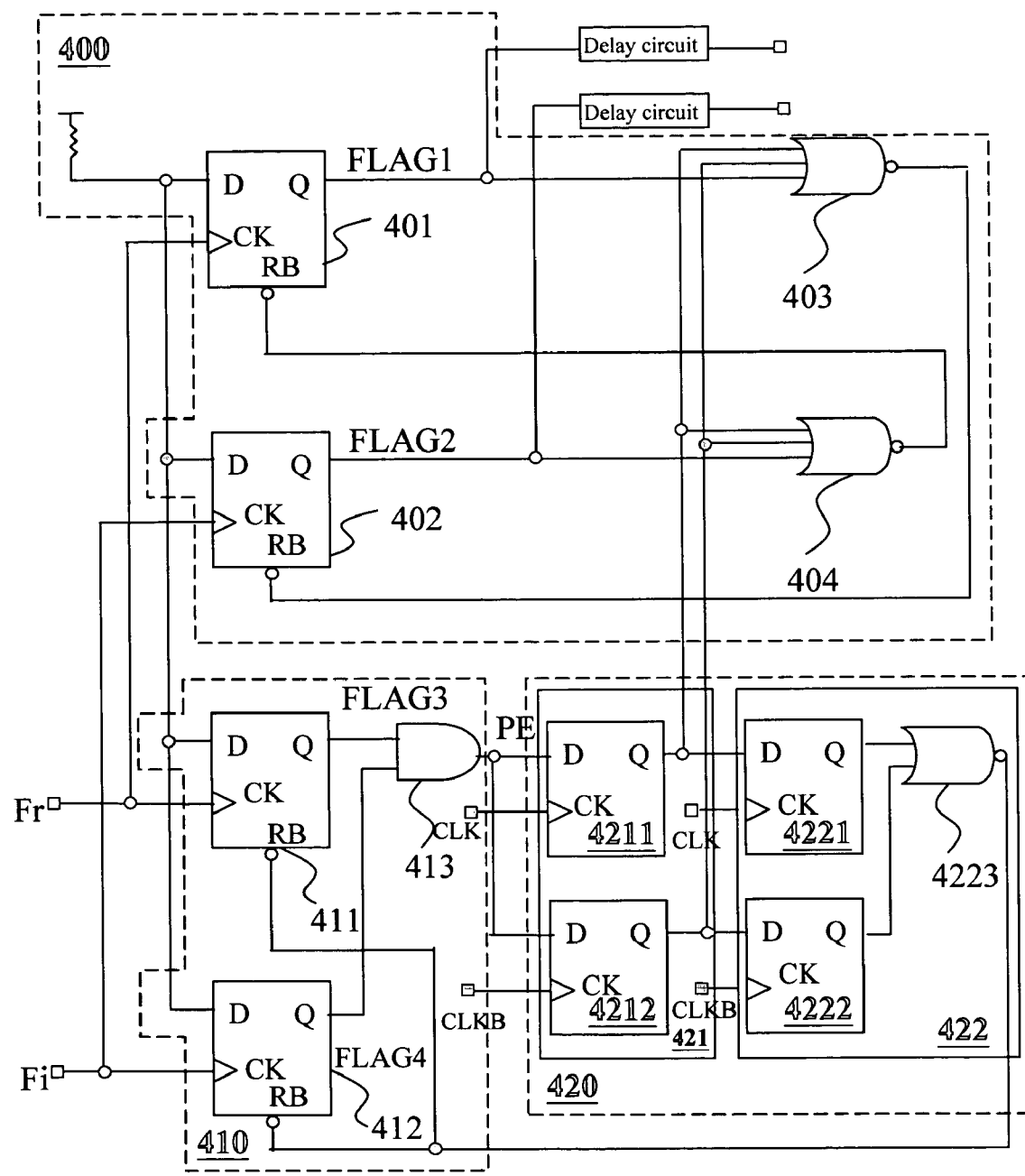
FIG. 8 is a detailed circuit diagram showing a phase frequency detector in FIG. 4 according to yet another embodiment of the invention.

The invention further proposes yet another embodiment, as shown in FIG. 8. The difference between FIGS. 8 and 7 is that the reset unit 420 of FIG. 8 includes a first reset unit 421 and a second reset unit 422. The first reset unit 421 includes a fifth flip-flop 4211 and a sixth flip-flop 4212 as in FIG. 7. The second reset unit 422 includes a seventh flip-flop 4221, an eighth flip-flop 4222, and a NOR gate 4223. The seventh flip-flop 4221 has a signal input terminal coupled to the signal output terminal of the fifth flip-flop 4211, and a clock input terminal CK receiving the clock signal CLK. The eighth flip-flop 4222 has a signal input terminal coupled to the signal output terminal of the sixth flip-flop 4212, and a clock input terminal CK receiving the complementary clock signal CLKB.

Those skilled in the art will be able to appreciate that one of the aims of the embodiment of the present invention shown in FIG. 8, which adopts two flip-flop pairs (i.e., flip-flop pair 4211, 4212 and flip-flop pair 4221, 4222) coupled in series in the reset unit 420, is to account for the potential glitch phenomenon, or occurrence of meta-stable when simultaneous or closely subsequent transition in the signal PE and the clock signal, in the reset signals (i.e., RESET1/RESET2) outputted from the fifth and sixth flip-flops 4211, 4212, which may cause erroneous operation in later stages.

It is to be noted that the implementation of the invention is illustrated by taking the rising-edge trigger circuit as an example of the circuit device in these embodiments, but the invention is not limited thereto. The circuit devices may also be falling-edge triggered devices or a rising/falling-edge triggered devices. In addition, although the disclosed embodiments of the present invention utilize D-type flip-flops and NOR gates in constructing the PFD, the invention is not limited thereto.

While the invention has been described by way of examples and in terms of illustrated embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A phase frequency detector comprising:
   a phase error detector outputting a phase error signal according to a first input signal and a second input signal;
   a phase error judgment unit outputting a phase error judgment signal according to the first input signal and the second input signal; and
   a reset unit outputting a first reset signal according to the phase error judgment signal and receiving a clock signal, the first reset signal resetting the phase error detector, wherein the outputting of the first reset signal is triggered by the clock signal.

2. The phase frequency detector according to claim 1, wherein the phase error judgment unit is reset according to the first reset signal.

3. The phase frequency detector according to claim 1, wherein the reset unit further outputs a second reset signal according to the phase error judgment signal, the second reset signal resetting the phase error judgment unit.

4. The phase frequency detector according to claim 1, wherein whenever there exists a substantial phase error between the first and second input signals, the phase error signal remains active for such a certain period of time that a post-stage circuit senses the existence of the phase error.

5. The phase frequency detector according to claim 1, wherein the phase error judgment signal is active when transitions are detected in both the first input signal and the second input signal.

6. The phase frequency detector according to claim 1, wherein the phase error detector comprises:
   a first flip-flop receiving the first input signal; and
   a second flip-flop receiving the second input signal;
   wherein an output of the first flip-flop resets the second flip-flop, and independently an output of the second flip-flop resets the first flip-flop.

7. The phase frequency detector according to claim 1, wherein the phase error judgment unit comprises:
   a third flip-flop receiving the first input signal;
   a fourth flip-flop receiving the second input signal; and
   a phase error judgment signal output unit coupled to the third and fourth flip-flops for outputting the phase error judgment signal.

8. The phase frequency detector according to claim 1, wherein the reset unit comprises a reset flip-flop receiving the phase error judgment signal, for generating the first reset signal.

9. The phase frequency detector according to claim 1, wherein the reset unit comprises:
   a fifth flip-flop receiving the phase error judgment signal; and
   a sixth flip-flop receiving the phase error judgment signal.

10. The phase frequency detector according to claim 7, wherein the reset unit further comprises:
    a seventh flip-flop coupled to the fifth flip-flop; and
    an eighth flip-flop coupled to the sixth flip-flop.

11. A phase locked loop, comprising:
    a phase frequency detector outputting a phase error signal according to a first input signal and a second input signal;
    a quantizer outputting a count signal according to the phase error signal; and
    an oscillator generating the second input signal according to the count signal;
    wherein the phase frequency detector comprises:
    a phase error detector outputting the phase error signal according to the first input signal and the second input signal;
    a phase error judgment unit outputting a phase error judgment signal according to the first input signal and the second input signal; and
    a reset unit outputting a first reset signal according to the phase error judgment signal, the first reset signal resetting the phase error detector, wherein the quantizer is triggered by a clock signal, and the reset unit is also triggered by the clock signal.

12. The phase locked loop according to claim 11, wherein the phase error judgment unit is reset according to the first reset signal.

13. The phase locked loop according to claim 11, wherein the reset unit further outputs a second reset signal according to the phase error judgment signal, the second reset signal resetting the phase error judgment unit.

14. The phase locked loop according to claim 11, wherein whenever there exists a substantial phase error between the first and second input signals, the phase error signal remains active for such a certain period of time that the quantizer outputs a count value in the count signal.

15. The phase locked loop according to claim 11, wherein the phase error judgment signal is active when transitions are detected in both the first input signal and the second input signal.

16. The phase locked loop according to claim 11, wherein the phase error detector comprises:
 a first flip-flop receiving the first input signal; and
 a second flip-flop receiving the second input signal;
wherein an output of the first flip-flop resets the second flip-flop, and independently an output of the second flip-flop resets the first flip-flop.

17. A phase frequency detector comprising:
 a phase error detector outputting a phase error signal according to a first input signal and a second input signal;
 a phase error judgment unit outputting a phase error judgment signal according to the first input signal and the second input signal; and
 a reset unit outputting a first reset signal and a second reset signal according to the phase error judgment signal, the first reset signal resetting the phase error detector, the second reset signal resetting the phase error judgment unit.

* * * * *